(12) United States Patent
Chen et al.

(10) Patent No.: US 8,071,401 B2
(45) Date of Patent: *Dec. 6, 2011

(54) METHOD OF FORMING VERTICAL STRUCTURE LIGHT EMITTING DIODE WITH HEAT EXHAUSTION STRUCTURE

(75) Inventors: Shiue-Lung Chen, Taoyuan (TW); Jeng-Kuo Feng, Taoyuan (TW); Ching-Hwa Chang Jean, Taoyuan (TW); Jang-Ho Chen, Taoyuan (TW)

(73) Assignee: Walsin Lihwa Corporation, Taoyuan (TW)

( * ) Notice: Subject to any disclaimer, the term of this patent is extended or adjusted under 35 U.S.C. 154(b) by 50 days.

This patent is subject to a terminal disclaimer.

(21) Appl. No.: 12/634,747

(22) Filed: Dec. 10, 2009

(65) Prior Publication Data

US 2011/0143466 A1 Jun. 16, 2011

(51) Int. Cl.
*H01L 21/00* (2006.01)
(52) U.S. Cl. .............. 438/29; 438/22; 438/28; 438/46; 438/455; 438/456; 438/458; 438/483
(58) Field of Classification Search .............. 438/22, 438/28, 29, 46, 455, 456, 458, 483
See application file for complete search history.

(56) References Cited

U.S. PATENT DOCUMENTS

| | | | | |
|---|---|---|---|---|
| 6,303,405 B1 * | 10/2001 | Yoshida et al. | ................. | 438/46 |
| 7,250,638 B2 * | 7/2007 | Lee et al. | ......................... | 257/99 |
| 7,781,242 B1 * | 8/2010 | Chen et al. | ..................... | 438/29 |
| 7,829,909 B2 * | 11/2010 | Yoo | ................. | 257/99 |
| 2003/0114017 A1 * | 6/2003 | Wong et al. | ................... | 438/778 |
| 2006/0105542 A1 * | 5/2006 | Yoo | ................. | 438/455 |
| 2009/0111205 A1 * | 4/2009 | Lee et al. | ........................ | 438/46 |
| 2010/0163887 A1 * | 7/2010 | Kim et al. | ........................ | 257/76 |
| 2010/0244063 A1 * | 9/2010 | Yokogawa et al. | ............. | 257/94 |
| 2010/0317131 A1 * | 12/2010 | Cho | ................. | 438/22 |

* cited by examiner

*Primary Examiner* — Kevin M Picardat
*Assistant Examiner* — Bac Au
(74) *Attorney, Agent, or Firm* — Bacon & Thomas, PLLC

(57) ABSTRACT

The present invention is to provide a method of forming a vertical structure light emitting diode with a heat exhaustion structure. The method includes steps of: a) providing a sapphire substrate; b) depositing a number of protrusions on the sapphire substrate, each of which has a height of p; c) forming a buffer layer having a number of recesses, each of which has a depth of q smaller than p so that when the protrusions are accommodated within the recesses of the buffer layer, a number of gaps are formed therebetween for heat exhaustion; d) growing a number of luminescent layers on the buffer layer, having a medium layer formed between the luminescent layers and the buffer layer; e) etching through the luminescent layers and the buffer layer to form a duct for heat exhaustion; f) removing the sapphire substrate and the protrusions by excimer laser lift-off (LLO); g) roughening the medium layer; and h) depositing electrodes on the roughened medium layer.

15 Claims, 14 Drawing Sheets

METHOD OF FORMING VERTICAL STRUCTURE LIGHT EMITTING DIODE WITH HEAT EXHAUSTION STRUCTURE

FIELD OF THE INVENTION

The present invention relates generally to a method of forming a vertical structure light emitting diode (LED). More specifically, the present invention relates to a method of forming a vertical structure light emitting diode (LED) having a duct and a number of gaps for heat exhaustion so that yield can be improved while laser lift-off (LLO) process is introduced and throughput of the LED can be raised.

BACKGROUND OF THE INVENTION

In recent years, the heat dissipation management is still the main issue on the development for packaged high power LEDs under high current driving. For the lateral current conducting structure epitaxied on sapphire substrate, there are drawbacks on the current crowding effect, high series resistance and poor heat dissipation.

Then, the disadvantage of poor heat sink of sapphire can be resolved by other heat dissipation substrate by laser lift-off (LLO) process using a short wavelength excimer source. For example, U.S. Pat. No. 7,384,807 to Yoo disclosed a method of fabricating a vertical structure opto-electronic device which includes fabricating a plurality of vertical structure opto-electronic devices on a crystal substrate, and then removing the substrate using a laser lift-off process. However the electrical and optical properties of LEDs are dependent on crystal quality of the epitaxial layers which are subject to additional chemical process (e.g. etching), mechanical process (e.g. lapping), and laser lift-off process. It may be needed for laser beam to scan an epitaxial wafer more than one time, which decreases the throughput and increases the chance of damaging the epitaxial layer of LEDs. Also, the laser lift-off equipment is expensive.

In order to achieve a high yield of LLO process, it is necessary to separate the island of epi-GaN by chemical or physical etching process to form a heat exhaustion structure (so called "street path"). The street path has a benefit of nitrogen gas release during LLO process to achieve high yield.

However, due to an increased dimension of the epi-GaN island, it is necessary to enlarge width of the street path to avoid adjacent islands from attack by the pressure of nitrogen released from photo-induced decomposition.

Sapphire ($Al_2O_3$) is the most popular substrate for epitaxial growth of AlInGaN-based materials in light emitting diodes (LEDs) manufacturing. However, the thermal conductivity of the sapphire substrate is not so good that the blue light emitting diode is limited to a lateral conducting structure with its positive and negative metal electrodes on the same side of the substrate. Thus, the structure substantially shrinks the lighting area. Besides, due to current crowding effect and lateral path, there are inevitable increases in series resistance (Rs) and forward voltage drop (Vf) of the LED device. The huge amount of heat generated decays external quantum efficiency directly.

Substituting a traditional sapphire substrate for a heat dissipation substrate by using excimer laser lift-off (LLO) technology has been used for many years. Although it is commercialized, the manufacturing cost of such LED device is still quite expensive due to its complex processes and low yield. According to the high bandgap energy of sapphire, a short wavelength (<355 nm) excimer laser beam can penetrate the polished sapphire substrate and be absorbed in the interface between sapphire and the epitaxial buffer layer (u-GaN). The absorbed energy is accumulated on the surface of u-GaN and converted to heat energy which allows u-GaN to be gasified and nitrogen gas to be released. Subsequently, the released nitrogen gas may cause damage to neighboring insolated epitaxial elements and the heat dissipation substrate due to the pressure thus formed. Therefore, the peeling of the fragile interface formed by bonding or electroplating technology may produce the issue on reliability, for example, fast degradation of light output power, increase of forward voltage drop after package. Therefore, no matter whether bonding process or plating process is used for manufacturing the heat dissipation substrate to replace the current one, it is necessary to use more complex processes to enhance the bonding strength of the interface between the heat dissipation substrate and the epitaxial element. In order to improve the yield rate of LLO, main isolated street path between adjacent two epitaxial elements is necessarily enlarged, which causes low production in a 2-inch wafer and indirectly increases the manufacturing cost.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In accordance with an aspect of the present invention, a method of forming a vertical structure light emitting diode (LED) with heat exhaustion structure includes the steps of: a) providing a sapphire substrate; b) depositing a number of protrusions on the sapphire substrate, each of which has a height of p; c) forming a buffer layer having a number of recesses, each of which has a depth of q smaller than p so that when the protrusions are accommodated within the recesses of the buffer layer, a number of gaps are formed therebetween for heat exhaustion; d) growing a number of luminescent layers on the buffer layer, having a medium layer formed between the luminescent layers and the buffer layer; e) etching through the luminescent layers and the buffer layer to form a duct for heat exhaustion; f) removing the sapphire substrate and the protrusions by excimer laser lift-off (LLO); g) roughening the medium layer; and h) depositing electrodes on the roughened medium layer.

Preferably, the protrusions are deposited by chemical vapor deposition (CVD) or physical vapor deposition (PVD), followed by photolithographic process, wet etching process, or dry etching process.

Preferably, the protrusions include $SiOx$, $Si_3N_4$, $TiOx$, $V_2O_5$, ITO, IZO, $ZrO_2$, $Ta_2O_5$, $Al_2O_3$, ZnO, MgO, or $MgF_2$.

Preferably, the protrusion has a cross-section shaped as an isosceles trapezoid with a base angle larger than 60° and a height p greater than 1 μm, and any adjacent two protrusions have a distance less than 1 μm.

Preferably, the protrusions form a strip pattern or a spot pattern.

Preferably, the buffer layer is shaped on the basis of parameters of growth temperature, growth time, and growth pressure thereof.

Preferably, the buffer layer is made from un-doped gallium nitride (u-GaN) used for blue LED or aluminum nitride (AlN) used for ultraviolet LED.

Preferably, the buffer layer is deposited by metal organic chemical vapor deposition (MOCVD) or high vapor-phase epitaxy (HVPE).

In accordance with another aspect of the present invention, a method of forming a vertical structure light emitting diode (LED) with heat exhaustion structure includes the steps of: a) providing a sapphire substrate; b) depositing a number of protrusions on the sapphire substrate, each of which has a protrusion width of m; c) forming a buffer layer having a number of recesses, each of which has a recess width of n larger than m so that when the protrusions are accommodated within the recesses of the buffer layer, a number of gaps are formed therebetween for heat exhaustion; d) growing a number of luminescent layers on the buffer layer, having a medium layer formed between the luminescent layers and the buffer layer; e) etching through the luminescent layers and the buffer layer to form a duct for heat exhaustion; f) removing the sapphire substrate and the protrusions by excimer laser lift-off (ILO); g) roughening the medium layer; and h) depositing electrodes on the roughened medium layer.

Preferably, the protrusions are deposited by chemical vapor deposition (CVD) or physical vapor deposition (PVD), followed by photolithographic process, wet etching process, or dry etching process.

Preferably, the protrusions include $SiO_x$, $Si_3N_4$, $TiO_x$, $V_2O_5$, ITO, IZO, $ZrO_2$, $Ta_2O_5$, $Al_2O_3$, ZnO, MgO, or $MgF_2$.

Preferably, the protrusions form a strip pattern or a spot pattern.

Preferably, the buffer layer is shaped on the basis of parameters of growth temperature, growth time, and growth pressure thereof.

Preferably, the buffer layer is made from un-doped gallium nitride (u-GaN) used for blue LED or aluminum nitride (AlN) used for ultraviolet LED.

Preferably, the buffer layer is deposited by metal organic chemical vapor deposition (MOCVD) or high vapor-phase epitaxy (HVPE).

DETAILED DESCRIPTION OF THE PREFERRED EMBODIMENT

Figure 1:
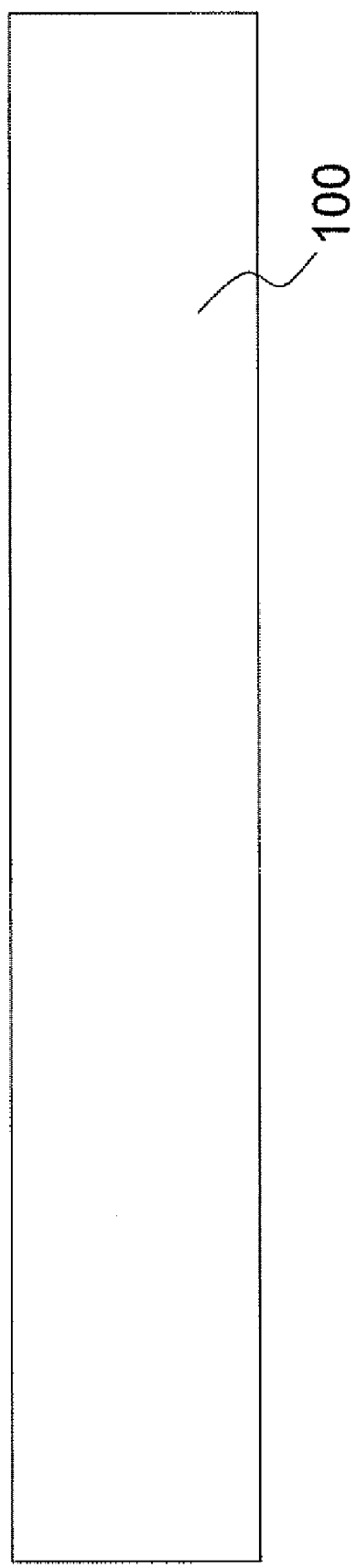
FIGS. 1 to 10 illustrate formation of a vertical structure LED according to the present invention.
Figure 2:
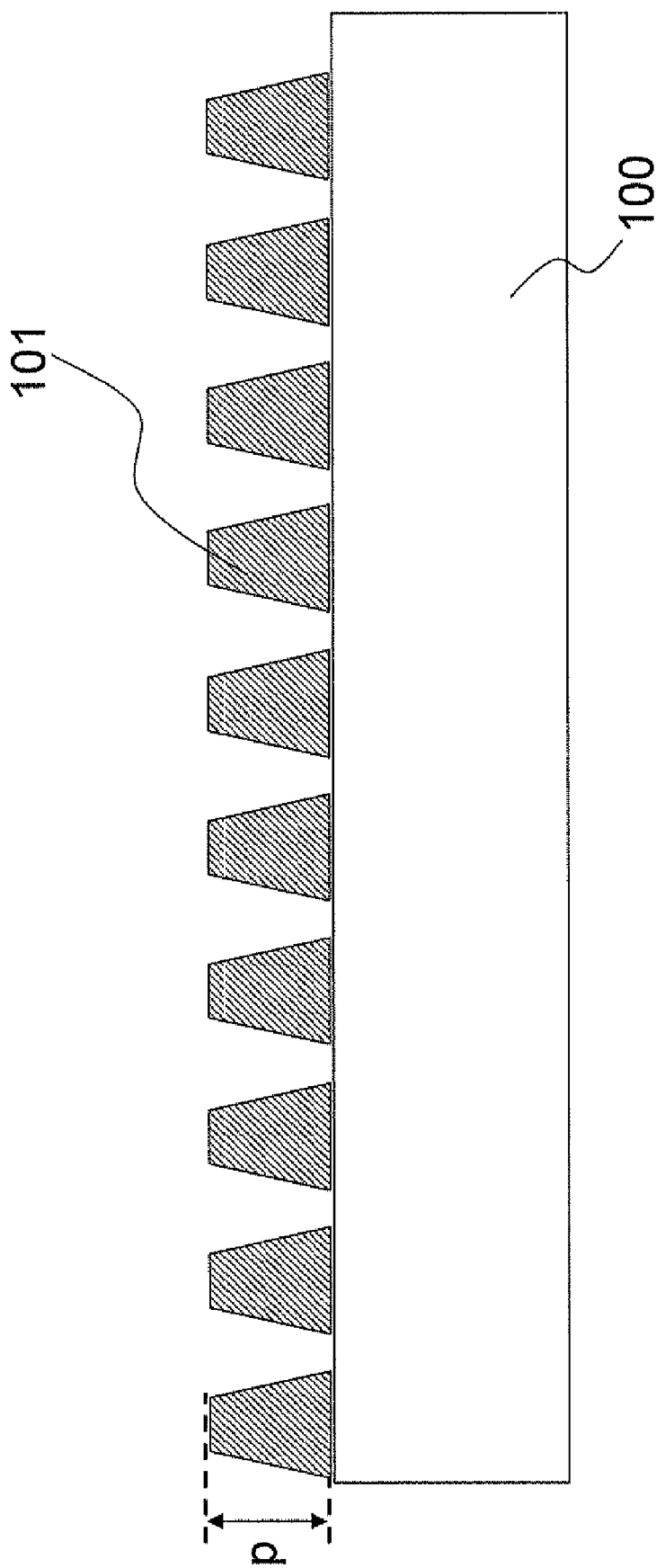
Figure 3:
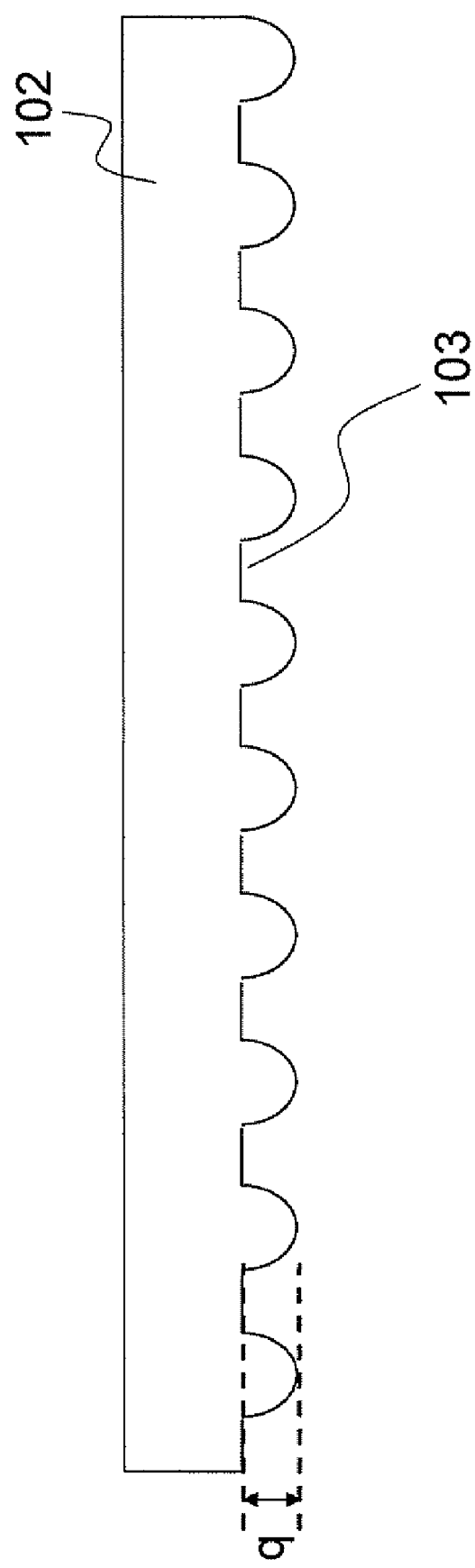
Figure 4A:
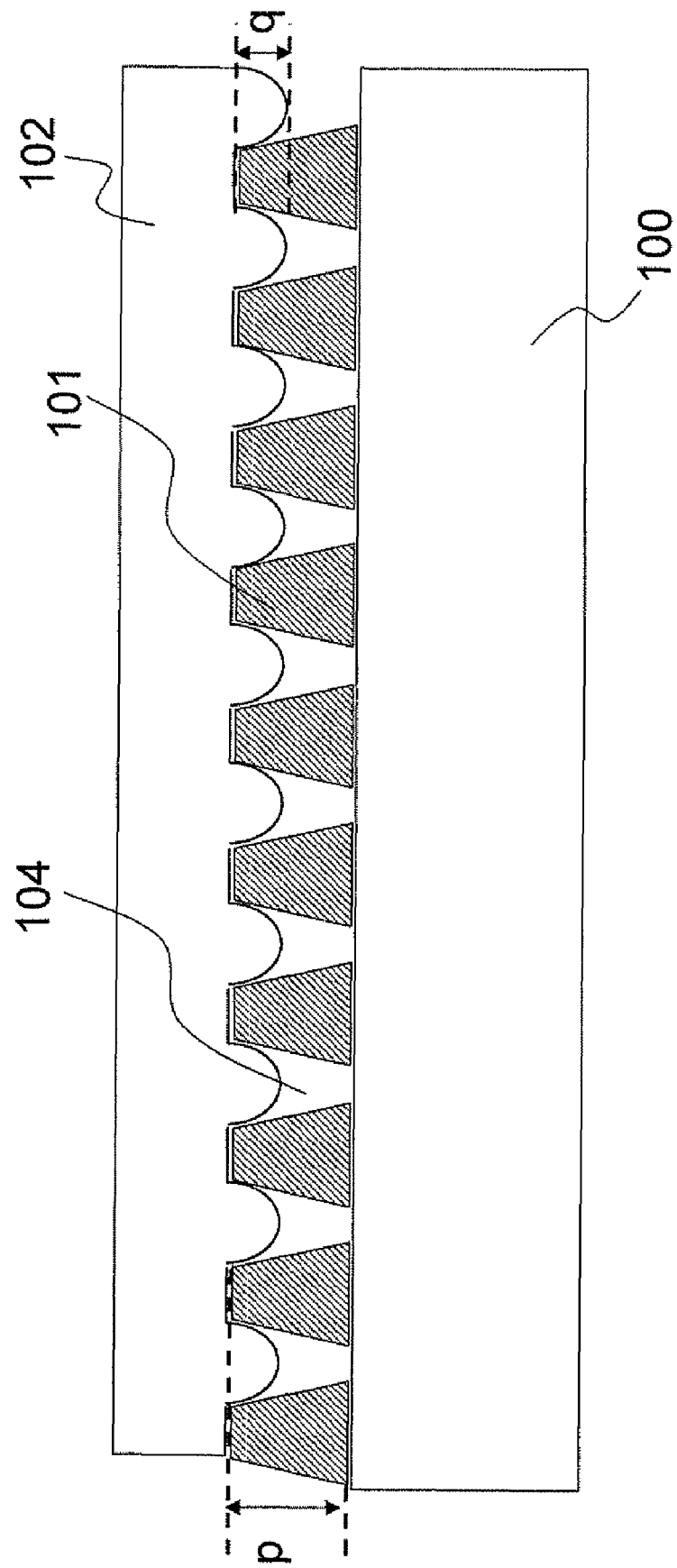
Figure 4B:
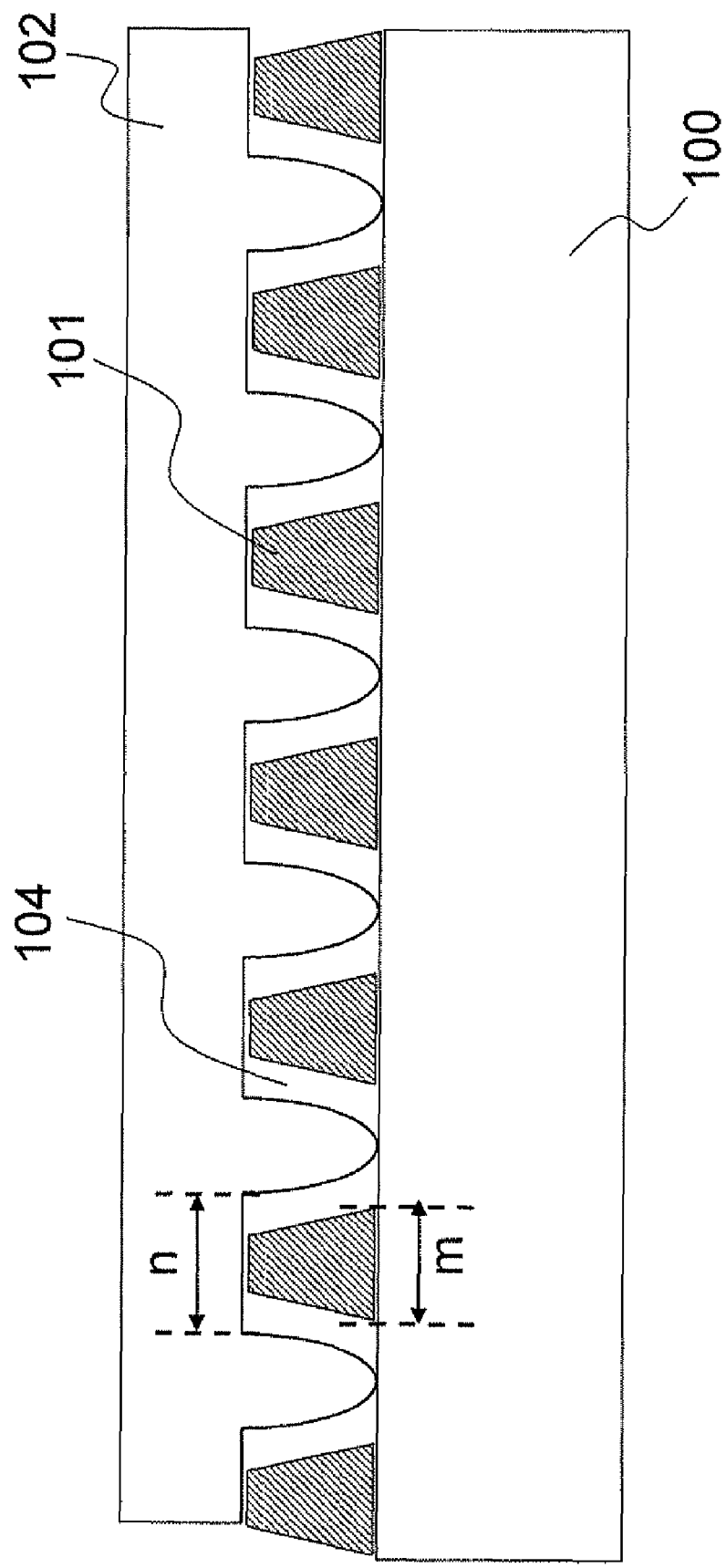
Figure 5:
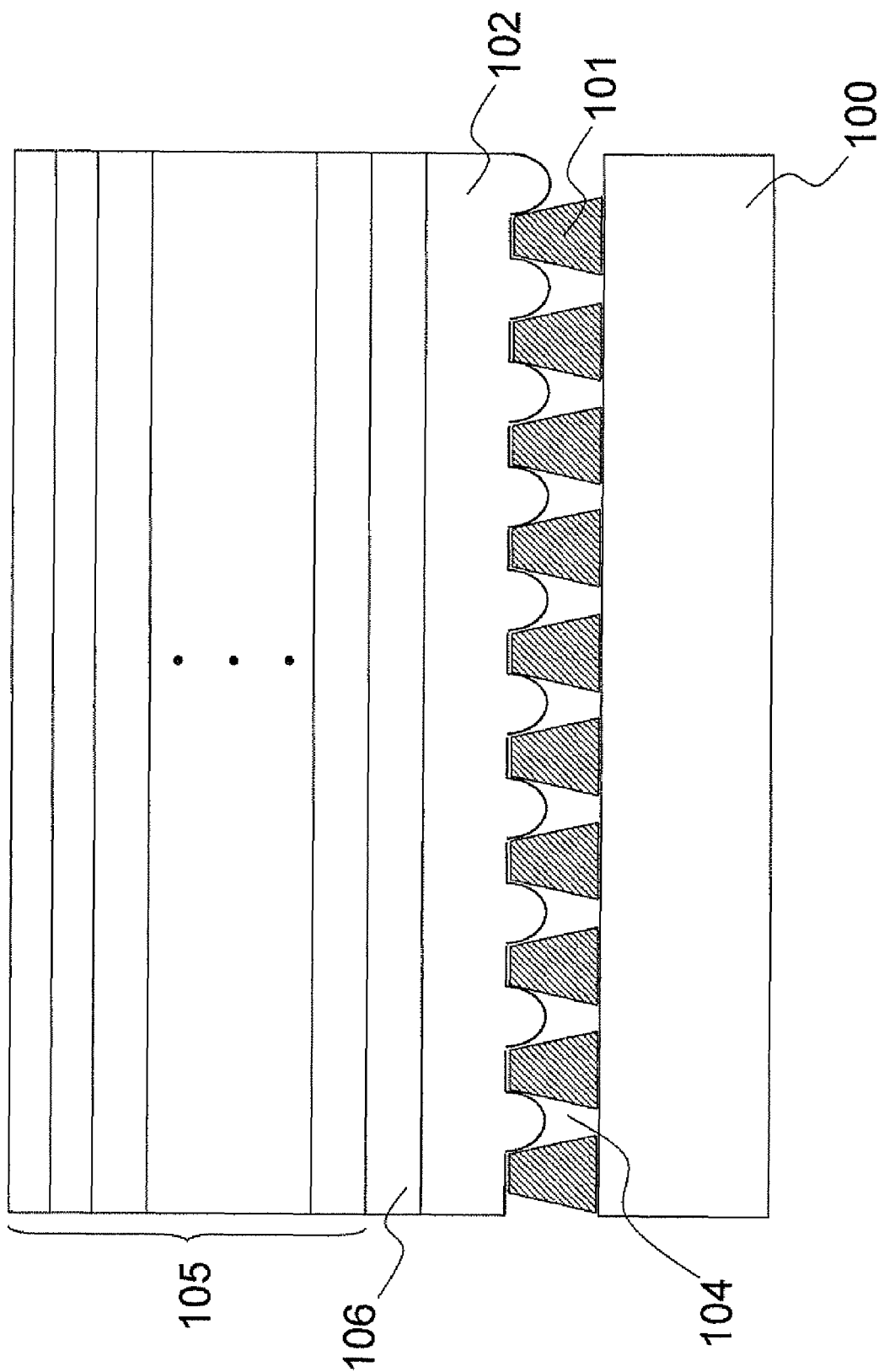
Figure 6:
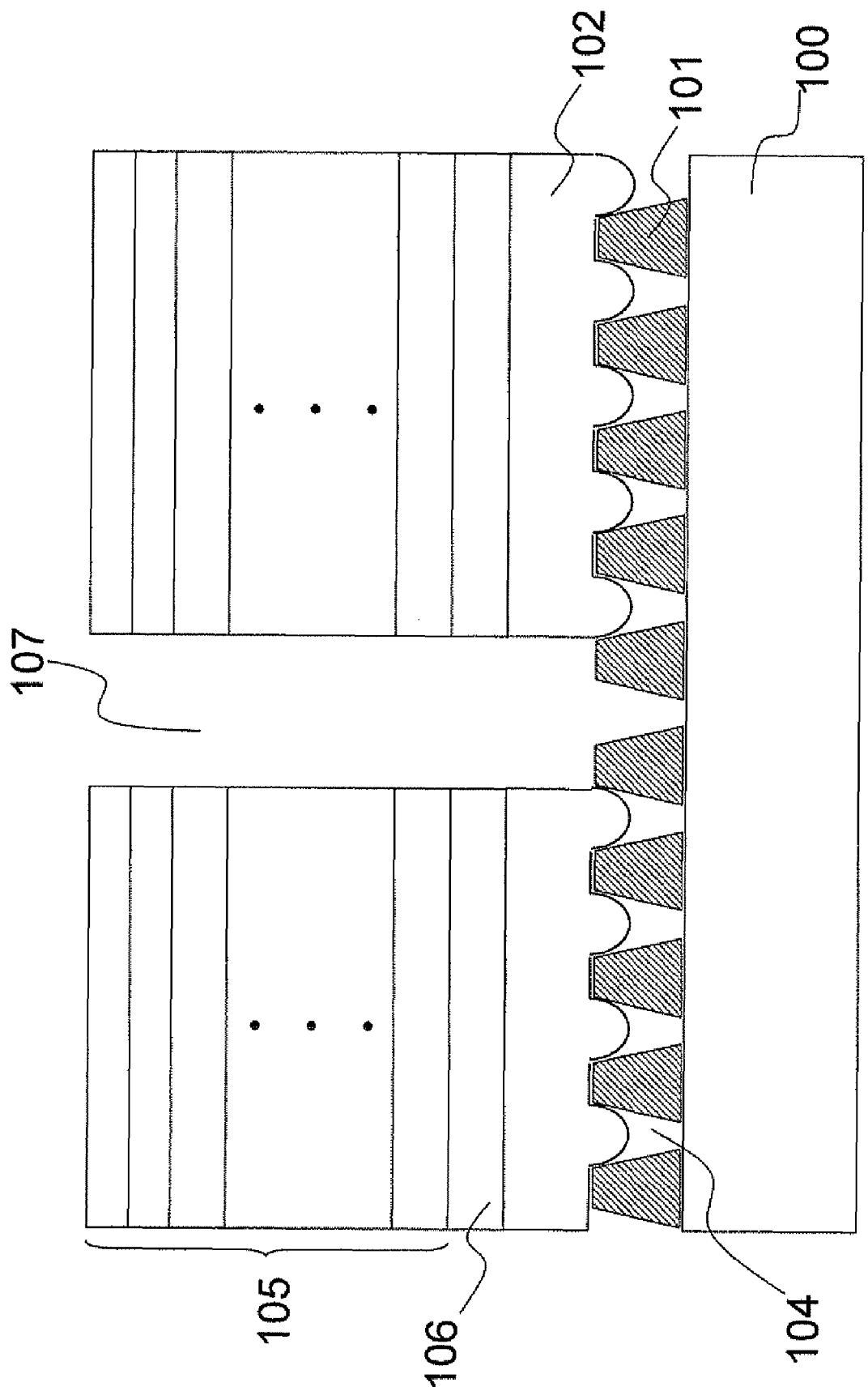
Figure 7:
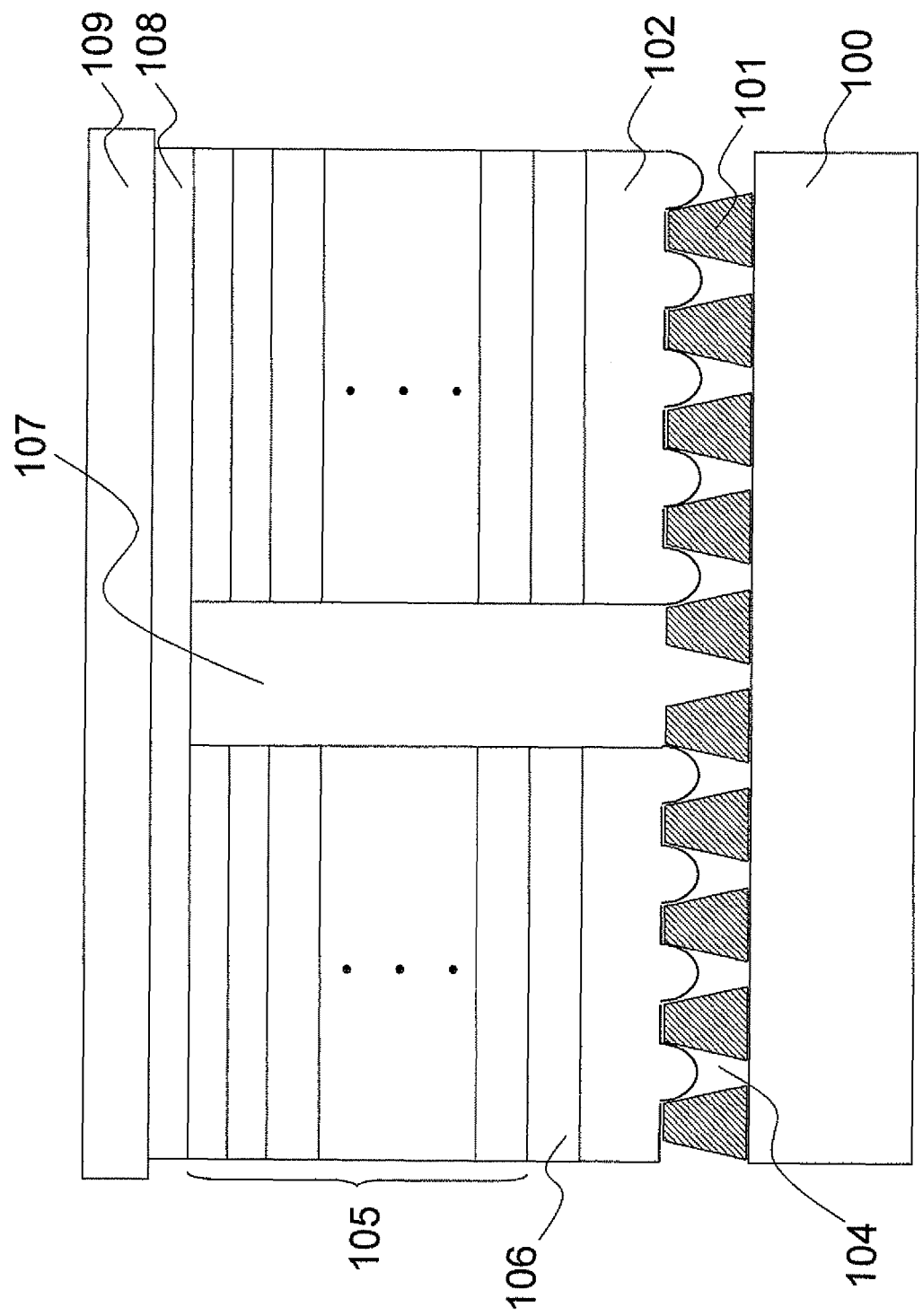
Figure 8:
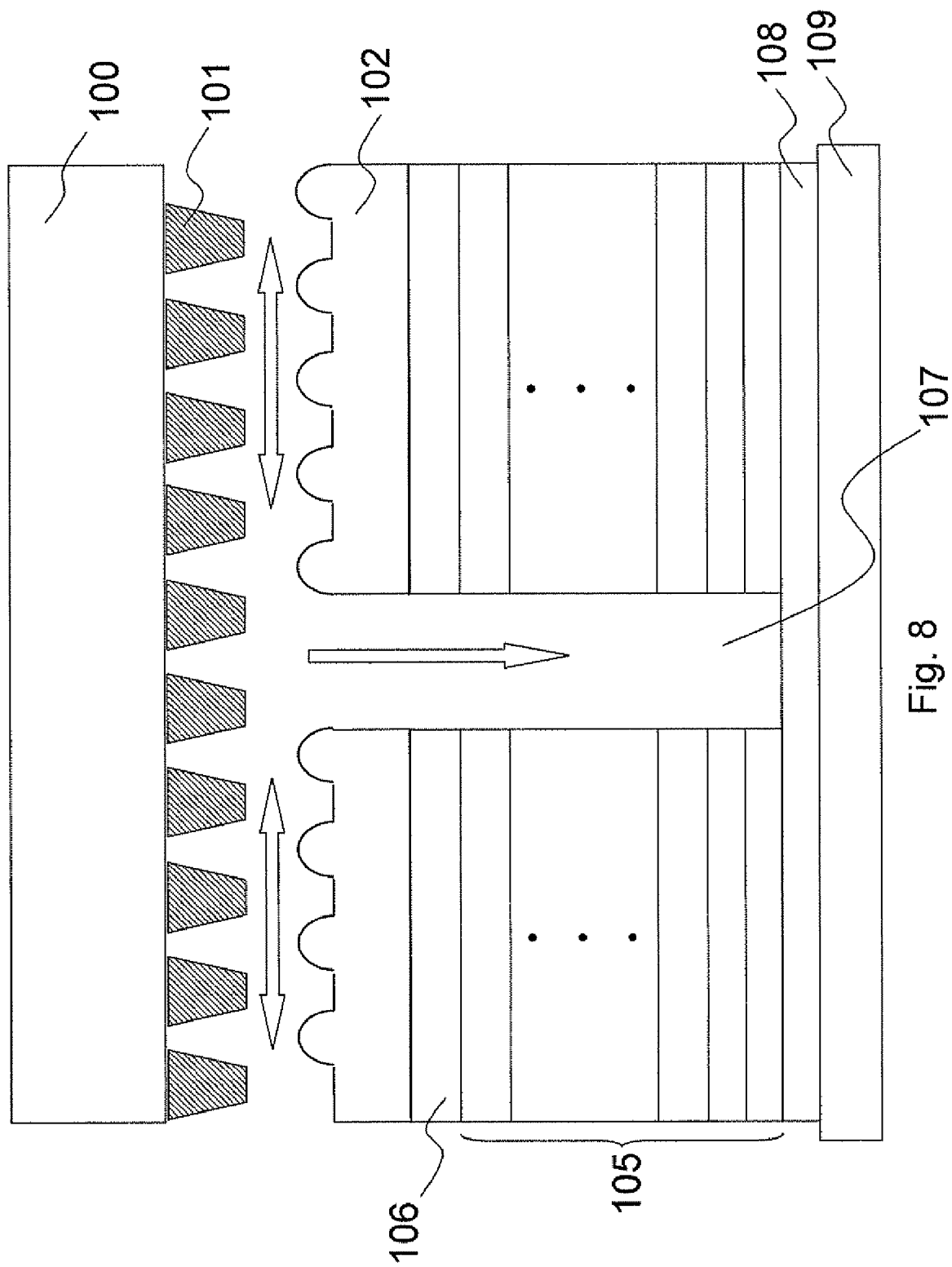
Figure 9:
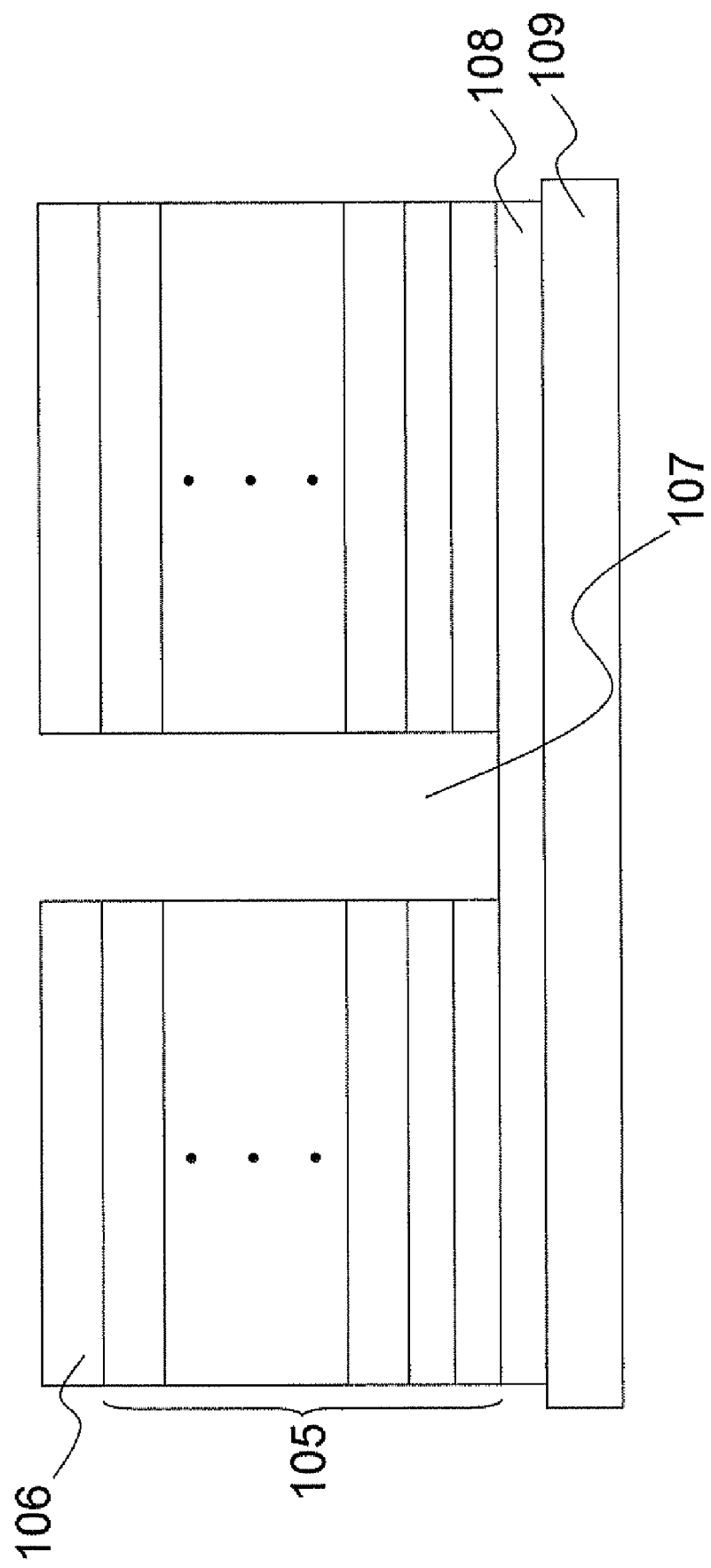
Figure 10:
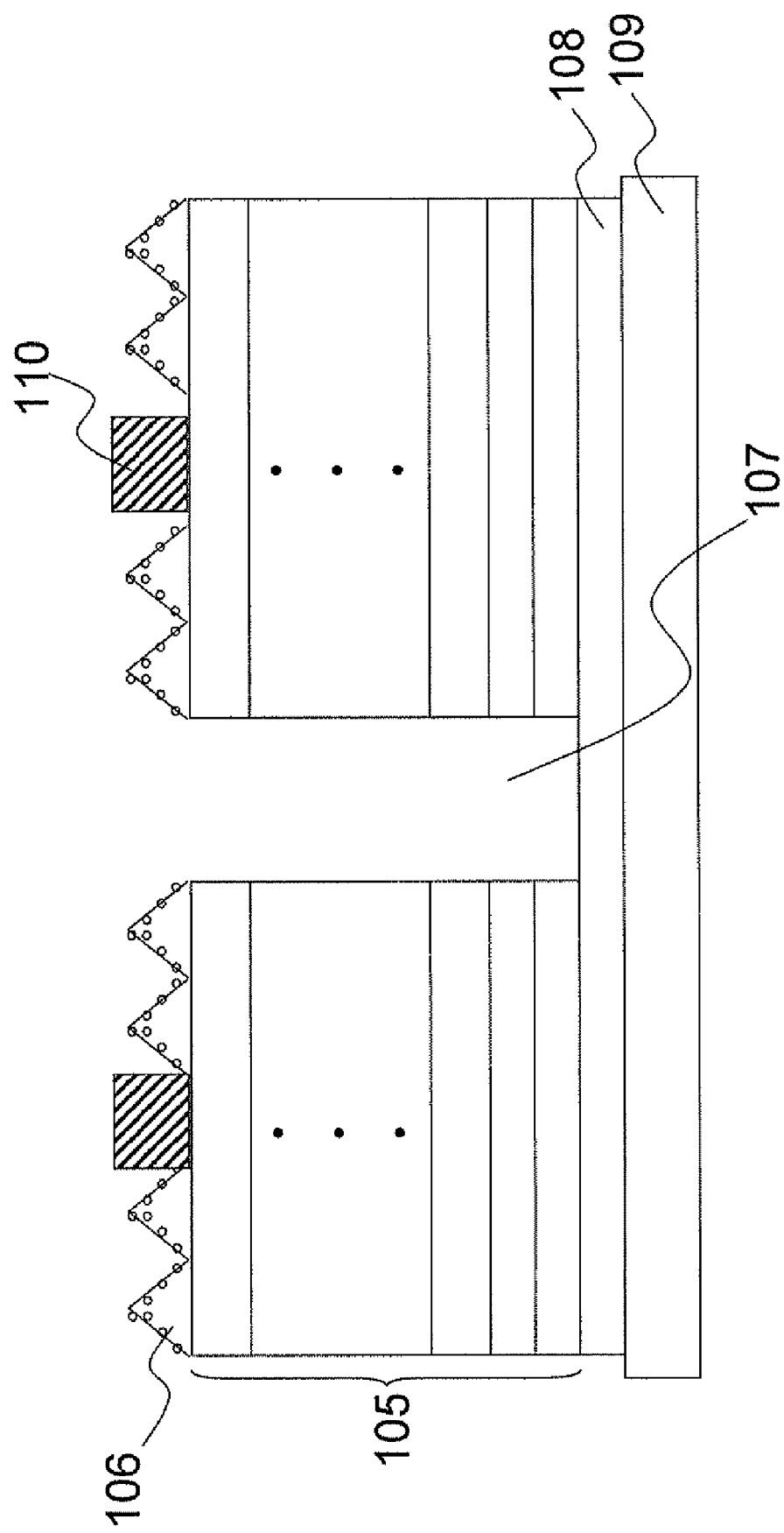

In order to exhaust heat caused by current crowding effect, a vertical structure light emitting diode with a heat exhaustion structure is desired. An embodiment of the present invention showing a method of forming a vertical structure light emitting diode with heat exhaustion structures is shown below.

Please refer to FIGS. 1 to 10. A first embodiment is illustrated. In this embodiment, a sapphire substrate 100 which has a polished surface is first provided. Then, a number of protrusions 101 are deposited on the sapphire substrate 100. Each of the protrusions 101 has a height of p and a protrusion width of m. Next, a buffer layer 102 having a number of recesses 103, each of which has a depth of q and a recess width of n, is formed above the protrusions 101. The protrusions 101 are accommodated within the recesses 103 of the buffer layer 102. A number of gaps 104 are formed for heat exhaustion between the sapphire substrate 100 and the buffer layer 102 by having the height p of the protrusion 101 larger than the depth q of the recess 103, as shown in FIG. 4A. Alternatively, the gaps 104 may also be formed by having the protrusion width m smaller than the recess width n, as shown in FIG. 4B.

Figure 11A:
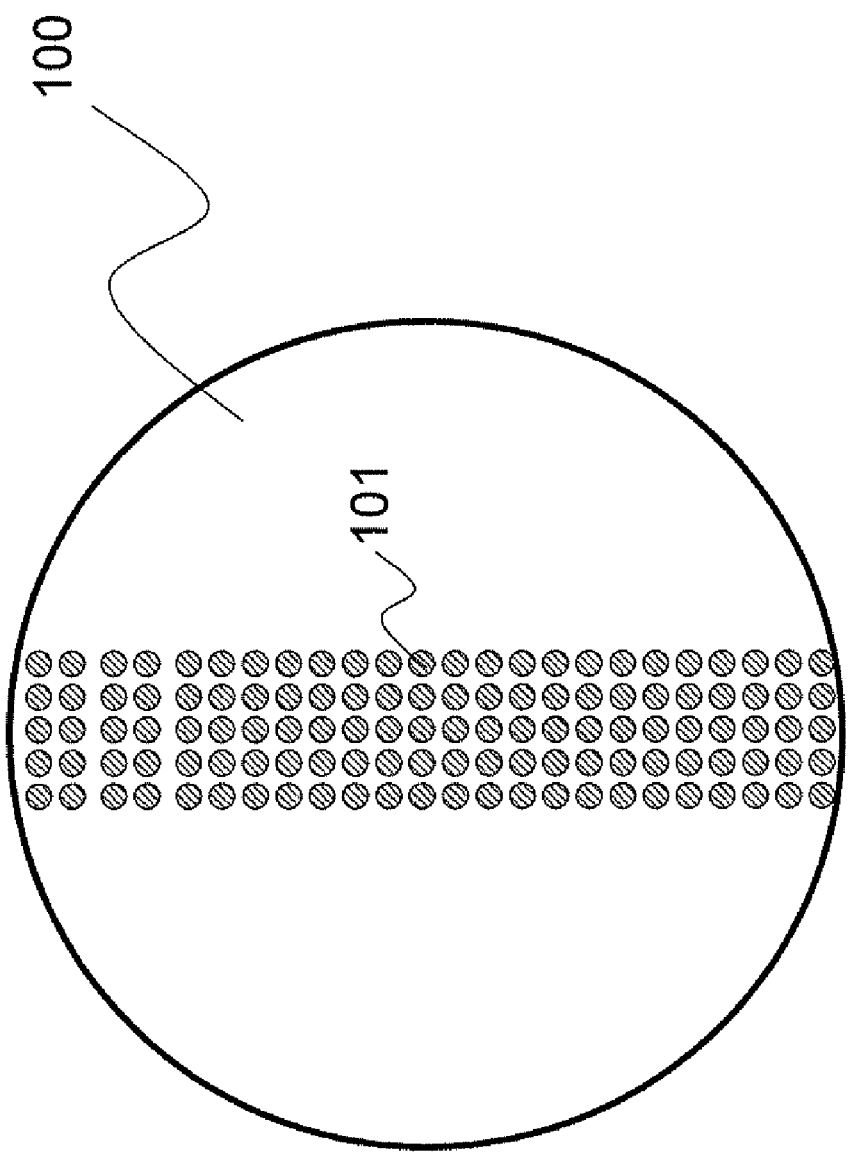
FIGS. 11A and 11B illustrate top views of protrusions on a substrate according to the present invention.
Figure 11B:
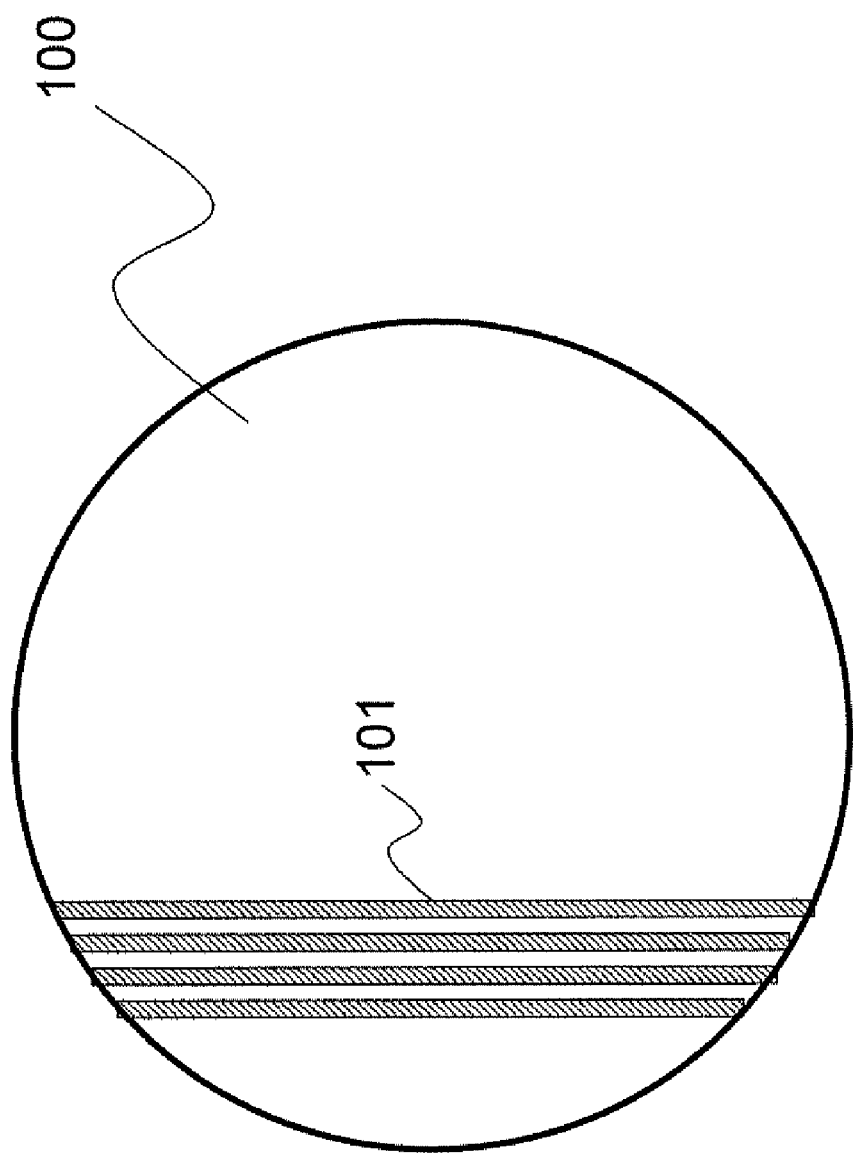

The protrusions 101 are formed by chemical vapor deposition (CVD) or physical vapor deposition (PVD), followed by a photolithographic process, an etching process, or the like. The protrusions 101 can form a pattern of spots (as shown in FIG. 11A), strips (as shown in FIG. 11B), or any repeated geometric shape. Shape and size of the pattern can be controlled by using a mask. The protrusions 101 are not limited to organic materials (such as monomers, oligomers, or polymers), and can also be made of inorganic materials such as $SiO_x$, $Si_3N_4$, $TiO_x$, $V_2O_5$, ITO, IZO, $ZrO_2$, $Ta_2O_5$, $Al_2O_3$, ZnO, MgO, $MgF_2$, etc. Furthermore, the protrusions 101 can also be a distributed bragg reflector (DBR). The protrusions 101 can be made by spin on glass technology.

The buffer layer 102 can be made from un-doped gallium nitride (u-GaN) used for blue LED or aluminum nitride (AlN) used for ultraviolet LED. The buffer layer 102 can be deposited by metal organic chemical vapor deposition (MOCVD) or high vapor-phase epitaxy (HVPE) and be shaped on the basis of parameters of growth temperature, growth time, and growth pressure thereof which also control the depth of the recess 103.

Figure 12:
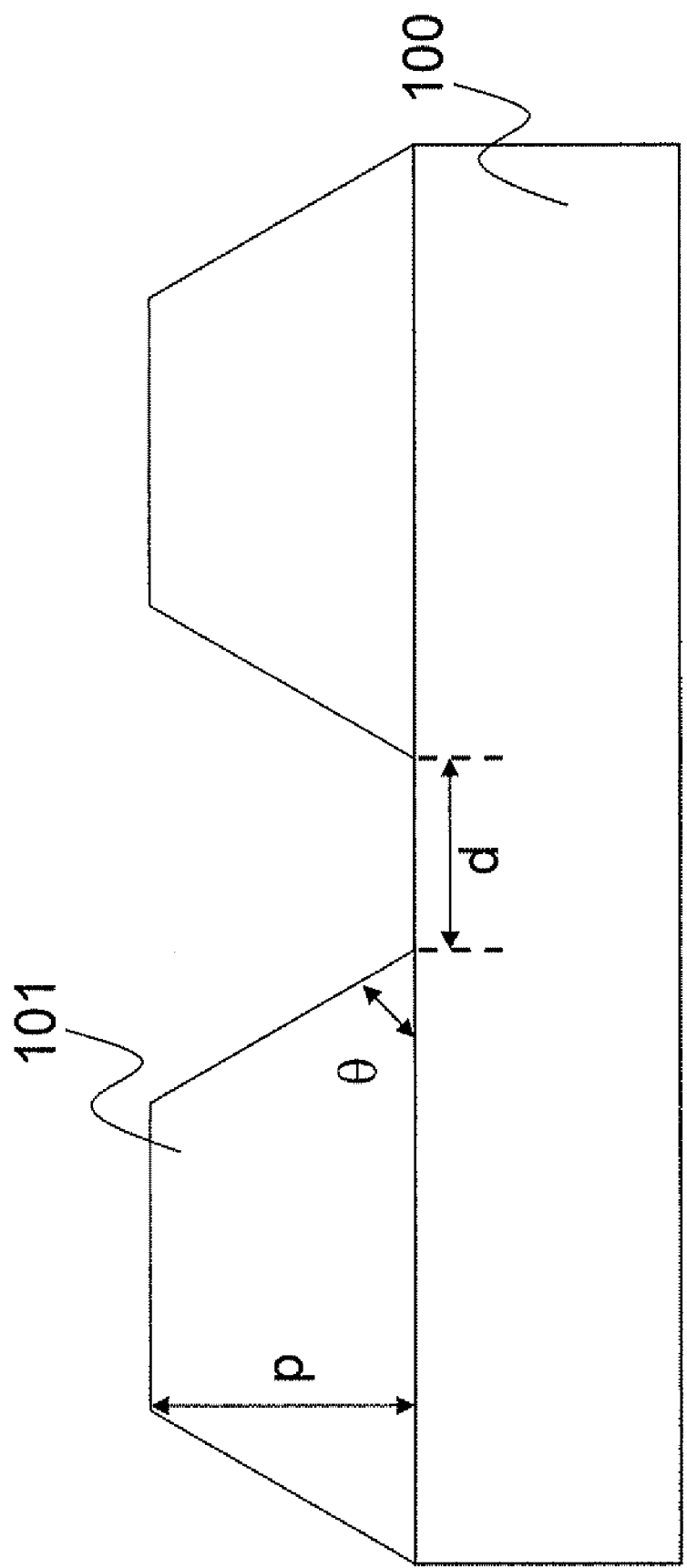
FIG. 12 illustrates a sectional view of an exemplary protrusion according to the present invention.

In this embodiment, the protrusion 101 has a cross-section shaped as an isosceles trapezoid as shown in FIG. 12. It would be preferred for the protrusion 101 to have a height of p larger than 1 μm and a base angle of θ between one side of the isosceles trapezoid and the sapphire substrate 100 larger than 60°. Moreover, any adjacent two protrusions 101 are preferred to have a distance d less than 1 μm. Although the protrusion 101 has an isosceles trapezoidal cross-section in this embodiment, it should be understood that the protrusion 101 is not limited thereto, it can also be formed in any other shapes, such as a smooth bump, a rectangle, or a triangle.

After the buffer layer 102 is formed, a number of luminescent layers 105 are grown on the buffer layer 102, having a medium layer 106 formed between the luminescent layers 105 and the buffer layer 102. The medium layer 106 may be made of n-GaN. The luminescent layers 105 may include an n-GaN layer, a multi-quantum well (MQW) layer, an aluminum gallium nitride (AlGaN) layer, a p-GaN layer, a conducting layer, a reflective layer, a protection layer, and a metal layer. Due to the fact that the structure of the luminescent layers of the light emitting diode is not the subject matter of the present invention, detailed description of the layers formed above the buffer layer 102 will be omitted hereinafter.

Next, a duct 107 is formed by etching through the luminescent layers 105 and the buffer layer 102 for heat exhaustion. In this embodiment, dry etching is used. However, plasma etching can also be used.

Later, a bonding substrate 109 used as a base structure for providing support for the LED is bonded on the luminescent layers 105 by a bonding material 108. The bonding material 108 may be nickel, gold, silver, or any other metal material which has good electrical conductivity and ductility. The bonding substrate 109 used in this embodiment is a copper plate. The aforementioned bonding of the substrate can be replaced with electroplating.

After that, the sapphire substrate 100 and protrusions 101 are removed by excimer laser lift-off (LLO) process. Gasified nitrogen and heat caused during the excimer laser lift-off (LLO) process will dissipate along the gaps 104 and the duct 107, so that cracks caused by pressure and heat in the LED structure can be avoided.

Then, the medium layer 106 is roughened and electrodes 110 are deposited on the roughened medium layer 106. The electrodes 110 may be made of copper, gold, nickel, silver, or other metal materials, and formed by vacuum evaporation plating. Finally, a vertical structure light emitting diode can be obtained.

While the invention has been described in terms of what is presently considered to be the most practical and preferred embodiment, it is understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method of forming a vertical structure light emitting diode (LED) with heat exhaustion structure, comprising the steps of:
    a) providing a sapphire substrate;
    b) depositing a plurality of protrusions on the sapphire substrate, each of which has a height of p;
    c) forming a buffer layer having a plurality of recesses, each of which has a depth of q smaller than p so that when the protrusions are accommodated within the recesses of the buffer layer, a plurality of gaps are formed therebetween for heat exhaustion;
    d) growing a plurality of luminescent layers on the buffer layer, having a medium layer formed between the plurality of luminescent layers and the buffer layer;
    e) etching through the plurality of luminescent layers and the buffer layer to form a duct for heat exhaustion;
    f) removing the sapphire substrate and the protrusions by excimer laser lift-off (LLO);
    g) roughening the medium layer; and
    h) depositing electrodes on the roughened medium layer.

2. The method according to claim 1, wherein the protrusions are deposited by chemical vapor deposition (CVD) or physical vapor deposition (PVD), followed by photolithographic process, wet etching process, or dry etching process.

3. The method according to claim 1, wherein the protrusions comprise $SiO_x$, $Si_3N_4$, $TiO_x$, $V_2O_5$, ITO, IZO, $ZrO_2$, $Ta_2O_5$, $Al_2O_3$, ZnO, MgO, or $MgF_2$.

4. The method according to claim 1, wherein the protrusion has a cross-section shaped as an isosceles trapezoid with a base angle larger than 60° and a height p greater than 1 μm, and any adjacent two protrusions have a distance less than 1 μm.

5. The method according to claim 1, wherein the protrusions form a strip pattern or a spot pattern.

6. The method according to claim 1, wherein the buffer layer is shaped on the basis of parameters of growth temperature, growth time, and growth pressure thereof.

7. The method according to claim 1, wherein the buffer layer is made from un-doped gallium nitride (u-GaN) used for blue LED or aluminum nitride (AlN) used for ultraviolet LED.

8. The method according to claim 1, wherein the buffer layer is deposited by metal organic chemical vapor deposition (MOCVD) or high vapor-phase epitaxy (HVPE).

9. A method of forming a vertical structure light emitting diode (LED) with heat exhaustion structure, comprising the steps of:
    a) providing a sapphire substrate;
    b) depositing a plurality of protrusions on the sapphire substrate, each of which has a protrusion width of m;
    c) forming a buffer layer having a plurality of recesses, each of which has a recess width of n larger than m so that when the protrusions are accommodated within the recesses of the buffer layer, a plurality of gaps are formed therebetween for heat exhaustion;
    d) growing a plurality of luminescent layers on the buffer layer, having a medium layer formed between the plurality of luminescent layers and the buffer layer;
    e) etching through the plurality of luminescent layers and the buffer layer to form a duct for heat exhaustion;
    f) removing the sapphire substrate and the protrusions by excimer laser lift-off (LLO);
    g) roughening the medium layer; and
    h) depositing electrodes on the roughened medium layer.

10. The method according to claim 9, wherein the protrusions are deposited by chemical vapor deposition (CVD) or physical vapor deposition (PVD), followed by photolithographic process, wet etching process, or dry etching process.

11. The method according to claim 9, wherein the protrusions comprise $SiO_x$, $Si_3N_4$, $TiO_x$, $V_2O_5$, ITO, IZO, $ZrO_2$, $Ta_2O_5$, $Al_2O_3$, ZnO, MgO, or $MgF_2$.

12. The method according to claim 9, wherein the protrusions form a strip pattern or a spot pattern.

13. The method according to claim 9, wherein the buffer layer is shaped on the basis of parameters of growth temperature, growth time, and growth pressure thereof.

14. The method according to claim 9, wherein the buffer layer is made from un-doped gallium nitride (u-GaN) used for blue LED or aluminum nitride (AlN) used for ultraviolet LED.

15. The method according to claim 9, wherein the buffer layer is deposited by metal organic chemical vapor deposition (MOCVD) or high vapor-phase epitaxy (HVPE).

* * * * *